United States Patent
Iguchi et al.

(10) Patent No.: US 12,243,859 B2
(45) Date of Patent: Mar. 4, 2025

(54) IMAGE DISPLAY ELEMENT

(71) Applicant: Sharp Fukuyama Laser Co., Ltd., Fukuyama (JP)

(72) Inventors: Katsuji Iguchi, Fukuyama (JP); Hiroaki Onuma, Fukuyama (JP); Shin Itoh, Fukuyama (JP); Shinsuke Anzai, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 553 days.

(21) Appl. No.: 17/540,091

(22) Filed: Dec. 1, 2021

(65) Prior Publication Data
US 2022/0173287 A1 Jun. 2, 2022

(30) Foreign Application Priority Data
Dec. 2, 2020 (JP) .................................. 2020-200339

(51) Int. Cl.
| | |
|---|---|
| *H01L 25/16* | (2023.01) |
| *G02B 3/00* | (2006.01) |
| *G02B 13/00* | (2006.01) |
| *H01L 25/075* | (2006.01) |
| *H01L 33/58* | (2010.01) |

(Continued)

(52) U.S. Cl.
CPC .......... *H01L 25/167* (2013.01); *G02B 3/0037* (2013.01); *G02B 3/0056* (2013.01); *G02B 13/0085* (2013.01); *H01L 25/0753* (2013.01); *H01L 33/58* (2013.01); *H01L 33/60* (2013.01); *G02B 3/0006* (2013.01); *G02B 13/0015* (2013.01); *G02B 27/0101* (2013.01); *G09F 9/33* (2013.01)

(58) Field of Classification Search
CPC ..... H01L 33/58; H01L 25/0753; H01L 33/60; H01L 25/167; G02B 3/0037; G02B 3/0056; G02B 3/0006; G02B 27/0101; G02B 27/01; G02B 13/0085; G02B 13/0015; G09F 9/33; H10K 50/586
See application file for complete search history.

(56) References Cited

U.S. PATENT DOCUMENTS

| | | | |
|---|---|---|---|
| 6,188,094 B1 * | 2/2001 | Kochi | ............... H01L 27/14629 |
| | | | 257/233 |
| 2007/0241673 A1 * | 10/2007 | Yamada | ............... H10K 50/858 |
| | | | 313/506 |

(Continued)

FOREIGN PATENT DOCUMENTS

| | | | |
|---|---|---|---|
| JP | 2002-141492 A | 5/2002 | |
| JP | 2019517032 A | 6/2019 | |
| JP | 2019152851 A * | 9/2019 | ......... H01L 25/0753 |

*Primary Examiner* — Ratisha Mehta
*Assistant Examiner* — Brad A Knudson
(74) *Attorney, Agent, or Firm* — ScienBiziP, P.C.

(57) ABSTRACT

An image display element includes pixels, a driving circuit substrate, a microlens, and an inter-pixel partition. The pixels are disposed in an array, each including a micro light emitting element. The driving circuit substrate includes a driving circuit configured to supply a current to the micro light emitting element and cause the micro light emitting element to emit light. The microlens is disposed for each of the pixels. The inter-pixel partition is disposed between the pixels and extends from a light emitting surface of the micro light emitting element to the microlens.

19 Claims, 11 Drawing Sheets

1: PIXEL REGION
5: PIXEL
10: INTER-PIXEL PARTITION
10S: INTER-PIXEL PARTITION SIDEWALL
15: OPTICAL PATH
20: MICROLENS
21: MICROLENS HOLDER
50: DRIVING CIRCUIT SUBSTRATE
100R: RED LIGHT EMITTING ELEMENT
100G: GREEN LIGHT EMITTING ELEMENT
100B: BLUE LIGHT EMITTING ELEMENT
110: INTER-LIGHT-EMITTING-ELEMENT PARTITION
130: LIGHT EMITTING SURFACE
200: IMAGE DISPLAY ELEMENT

(51) Int. Cl.
 *H01L 33/60* (2010.01)
 *G02B 27/01* (2006.01)
 *G09F 9/33* (2006.01)

(56) References Cited

U.S. PATENT DOCUMENTS

| | | |
|---|---|---|
| 2017/0242161 A1 | 8/2017 | Zhang et al. |
| 2019/0107765 A1 | 4/2019 | Whitehead et al. |
| 2023/0246004 A1* | 8/2023 | Mezouari ............... H01L 33/502 257/79 |
| 2023/0288660 A1* | 9/2023 | Schuberth .......... G02B 19/0014 |

* cited by examiner

IMAGE DISPLAY ELEMENT

CROSS-REFERENCE TO RELATED APPLICATION

The present application claims priority from Japanese Patent Application Number 2020-200339, the content to which is hereby incorporated by reference into this application.

BACKGROUND OF THE INVENTION

1. Field of the Invention

An aspect of the present disclosure relates to an image display element including a micro light emitting element.

2. Description of the Related Art

An image display element is proposed in which a plurality of micro light emitting elements constituting pixels are disposed on a substrate (backplane). For example, in a technology disclosed in JP 2002-141492 A, a driving circuit is formed on a silicon substrate, and an array of minute light emitting diodes (LEDs) configured to emit ultraviolet light is disposed on the driving circuit.

Further, in the technology described above, a micro display element is disclosed that is configured to display a color image by including, on the array of LEDs, a wavelength conversion layer that converts ultraviolet light into red, green, and blue visible light. In another form, there is also proposed a method for full color display by using three monochrome display elements in each of which a compound semiconductor that emits blue, green, or red light is layered on a driving circuit.

Such a display element has characteristics such as small size, high brightness, and high durability. Therefore, such a display element is expected to be used as a display element for display devices such as glasses-like devices and head-up displays (HUDs).

In order to improve the power efficiency of the display device described above, it is necessary to improve the luminous efficiency of such an image display element, and also to cause an optical system of the display device to efficiently capture light generated by the image display element. Thus, as disclosed in US 2017/0242161 A, it is proposed to provide a microlens on a micro light emitting element in order to improve the light extraction efficiency and distribute emission light strongly in the forward direction.

SUMMARY OF THE INVENTION

In an image display element for glasses-like devices and head-up displays, when realizing bright display, light emitted from pixels is preferably concentrated in the forward direction. For this purpose, a microlens may be used.

However, when a configuration that uses the microlens is adopted, there is a problem in that a phenomenon (optical crosstalk) in which light leaks from one pixel to an adjacent pixel easily occurs (see FIG. 11).

An aspect of the present disclosure has been made in light of the problem described above, and an object of the aspect of the present disclosure is to provide, as an image display element including fine pixels, a highly efficient and high-quality image display element configured to emit light strongly distributed in the forward direction and suppress optical crosstalk.

In order to solve the problem described above, an image display element according to an aspect of the present disclosure includes pixels disposed in an array, each including a micro light emitting element, a driving circuit substrate including a driving circuit configured to supply a current to the micro light emitting element and cause the micro light emitting element to emit light, a micro lens disposed for each of the pixels, and an inter-pixel partition disposed between the pixels and extending from a light emitting surface of the micro light emitting element to the microlens.

In order to solve the problem described above, an image display element according to another aspect of the present disclosure includes pixels disposed in an array, each including a micro light emitting element, a driving circuit substrate including a driving circuit configured to supply a current to the micro light emitting element and cause the micro light emitting element to emit light, a microlens disposed for each of the pixels, and a transparent portion disposed between the micro light emitting element and the microlens. The transparent portion is divided for each of the microlenses, and a space is provided between the transparent portions adjacent to each other.

According to an aspect of the present disclosure, an image display element is provided that prevents optical crosstalk between micro light emitting elements adjacent to each other and performs light distribution control so that light is strongly emitted in the forward direction. As a result, an image display element having high contrast, high color purity, and low power consumption can be provided.

DETAILED DESCRIPTION OF THE INVENTION

Configuration According to Comparative Example

Before specifically describing an aspect of the present disclosure, a configuration according to a comparative example will be summarized below.

Figure 11:
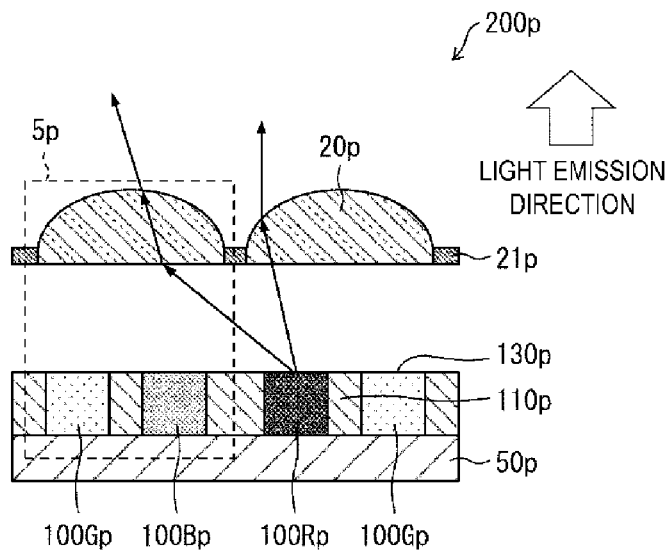
FIG. 11 is a cross-sectional view for describing optical crosstalk in relation to microlenses in the related art.

FIG. 11 is a diagram illustrating the configuration according to the comparative example. In FIG. 11, a reference sign 100Bp denotes a blue light emitting element, a reference sign 100Rp denotes a red light emitting element, a reference sign 100Gp denotes a green light emitting element, a reference sign 110p denotes an inter-light-emitting-element partition, a reference sign 130p denotes a light emitting surface, a reference sign 5p denotes a pixel, a reference sign 20p denotes a microlens, a reference sign 21p denotes a microlens holder, a reference sign 50p denotes a driving circuit substrate, and a reference sign 200p denotes an image display element.

In the configuration illustrated in FIG. 11, by using the microlenses, light that is strongly distributed in the forward direction can be emitted, but there are problems as described below.

Specifically, in the configuration illustrated in FIG. 11, when the size of the pixel constituting the image display element is reduced, optical crosstalk occurs as a result of light leaking from one pixel to an adjacent pixel. The optical crosstalk causes a reduction in contrast, or a deterioration in color rendering properties due to color mixing, so the optical crosstalk is not desirable in the Image display element. When a microlens array is disposed, the distance between the light emitting surface of the pixel and the microlens is preferably maintained at a distance approximately the same as the focal length of the microlens, and in this case, a space is inevitably created between the microlens array and the light emitting surface. As a result, optical crosstalk occurs in which light emitted from one pixel enters the microlens of an adjacent pixel.

In the following, an image display element will be described that can emit light that is strongly distributed in the forward direction and can also suppress optical crosstalk by using microlenses.

Embodiments

Embodiments according to an aspect of the present disclosure will be described below with reference to FIG. 1 to FIG. 10 using, as an example, an image display element including a plurality of micro light emitting elements. Note that the image display element includes the plurality of micro light emitting elements and a driving circuit substrate 50, and the driving circuit substrate 50 supplies a current to the micro light emitting elements disposed in a pixel region 1 and controls light emission.

The micro light emitting elements are disposed in an array in the pixel region 1. The micro light emitting elements emit light to a side opposite to the driving circuit substrate 50. The light emitted to the outside is referred to as emission light. Unless otherwise specified, a surface from which the light is emitted by the micro light emitting element is referred to as a light emitting surface.

Note that, when describing a configuration of the image display element, unless otherwise specified, the light emitting surface is referred to as an upper surface (first surface), a surface opposite to the light emitting surface is referred to as a lower surface (second surface), and side surfaces other than the upper surface and the lower surface are referred to as side surfaces. Similarly, a light emission direction is referred to as upward, and the opposite direction thereto is referred to as downward. A direction that is perpendicular to the light emitting surface and that is toward the air is also referred to as a forward direction.

The micro light emitting element may be a light emitting diode element formed from a compound semiconductor or quantum dots, an organic EL element, or a light emitting element including an excitation light emitting element and a wavelength converter for down-converting excitation light.

For example, when the micro light emitting element emits light in a wavelength band that falls in a range from ultraviolet to red, the compound semiconductor is a nitride semiconductor (AlInGaN-based), and when the micro light emitting element emits light in a wavelength band that falls in a range from yellow-green to red, the compound semiconductor is an AlInGaP-based semiconductor. In a wavelength band that falls in a range from red to infrared, the compound semiconductor is an AlGaAs-based or GaAs-based semiconductor.

The excitation light emitting element is an element that emits light such as blue light, near-ultraviolet light, ultraviolet light, or the like, and is formed from a nitride semiconductor or organic EL. The wavelength converter is a resin material formed by dispersing nanoparticles such as quantum dots or quantum rods, or phosphor nanoparticles a resin, a resin material containing a dye, or the like.

Note that the light emitting surface of the micro light emitting element need not necessarily be a light emitting material as described above, and may be a transparent electrode, a transparent protective film, a color filter, a dielectric multilayer film, or the like.

The micro light emitting element includes an anode electrode and a cathode electrode, and is connected to a drive electrode on the driving circuit substrate 50. Since those elements are not directly related to the present disclosure, they are not illustrated in the drawings.

The driving circuit substrate 50 includes, in the pixel region 1, a micro light emitting element driving circuit that controls the current supplied no each of the micro light emitting elements, and includes, in a region other than the pixel region 1, a row selection circuit that selects each row of the micro light emitting elements disposed in a two-dimensional matrix, a column signal output circuit that outputs a light emission signal to each column, an image processing circuit that calculates the light emission signal based on an input signal, an input/output circuit, and the like.

A P-drive electrode (second drive electrode) and an N-drive electrode (first drive electrode) that are connected to the micro light emitting element are disposed at a surface on the bonding surface side of the driving circuit substrate 50.

The driving circuit substrate 50 is typically a silicon substrate (semiconductor substrate) for large scale integration (LSI), or a glass substrate for a thin film transistor (TFT), and can be manufactured using a known technique. Thus, its function and configuration are not described in detail.

Note that in the drawings, the micro light emitting element is illustrated in a shape close to a square, but the shape of the micro light emitting element is not particularly limited. The micro light emitting element may have any one of a variety of planar shapes such as a rectangle, a polygon, a circle, and an ellipse, and the largest length thereof is assumed to be 20 µm or less. The image display element is assumed to include at least three thousand of the micro light emitting elements integrated in the pixel region 1.

First Embodiment

Configuration of Image Display Element 200

Figure 1:
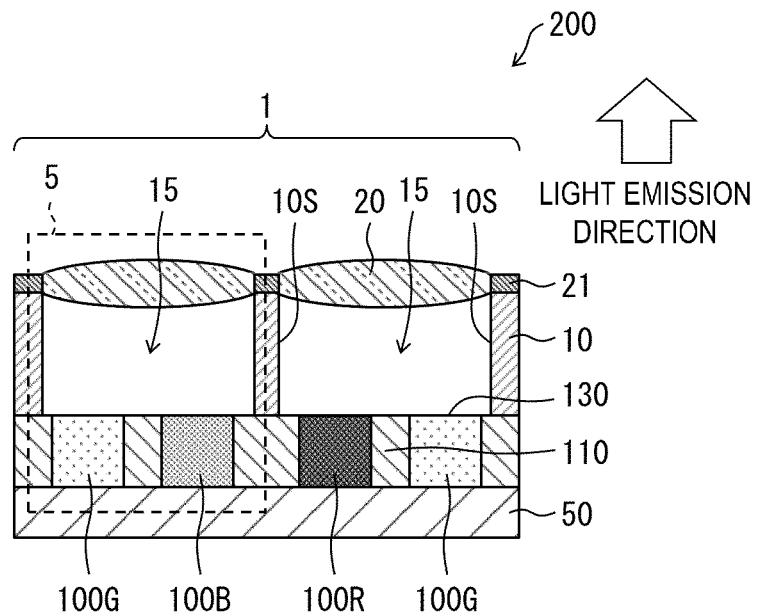
FIG. 1 is a schematic cross-sectional view of a pixel region of an image display element according to a first embodiment of the present disclosure.
Figure 2:
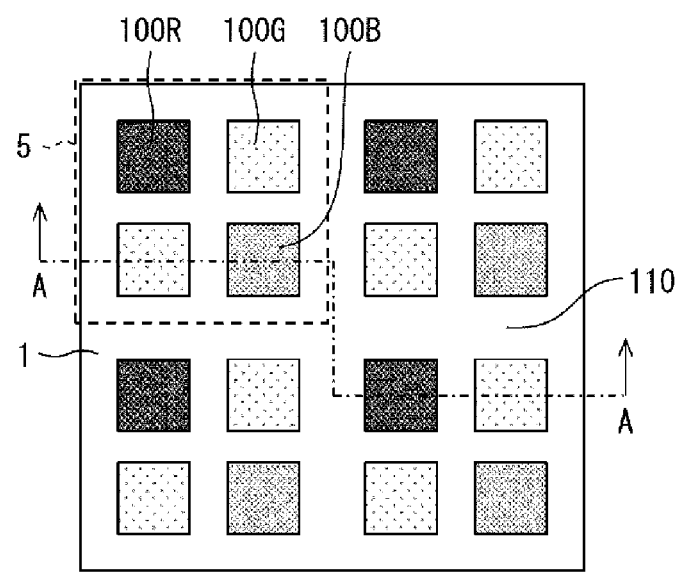
FIG. 2 is a schematic plan view of micro light emitting elements of the image display element according to the first embodiment of the present disclosure.
Figure 3:
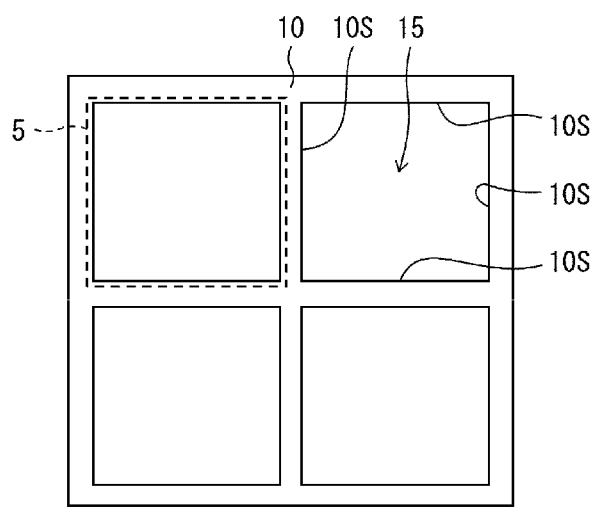
FIG. 3 is a schematic plan view of an inter-pixel partition of the image display element according to the first embodiment of the present disclosure.

FIG. 1 is a schematic cross-sectional view of the pixel region 1 of the image display element 200 according to a first embodiment of the present disclosure. FIG. 2 is a schematic plan view of a light emitting surface 130 of the micro light emitting elements 100 according to the first embodiment of the present disclosure. As illustrated in FIG. 2, the upper surface of the image display element 200 is provided with the pixel region 1 which a plurality of pixels 5 are arranged in an array.

In the present embodiment, the image display element 200 is a full-color display element, and each of the pixels 5 includes one blue light emitting element 100B, two green light emitting elements 100G, and one red light emitting element 100R. Note that the blue light emitting element 100B, the green light emitting element 100G, and the red light emitting element 100R are collectively referred to as the micro light emitting elements 100. In this configuration, the upper surface of the micro light emitting element 100 is the light emitting surface 130. In this way, the pixel 5 includes a plurality of the micro light emitting elements 100 that emit light at mutually different wavelengths.

The numbers and arrangements of the blue light emitting element 100B, the green light emitting element 100G, and the red light emitting element 100R included in the pixel 5 are not limited to those illustrated in FIG. 1 and FIG. 2, and various configurations are possible. The pixel 5 need not necessarily include all of the micro light emitting elements 100 such as the blue, green, and red light emitting elements as illustrated in FIG. 1 and FIG. 2. The pixel 5 may be a monochromatic light emitting pixel that includes only the blue light emitting element 100B, or similarly, may be formed by only the green light emitting element 100G or the red light emitting element 100R, or may include only two colors.

FIG. 1 illustrates a cross-sectional view taken along an A-A line in FIG. 2. The micro light emitting elements 100 are individually divided, and an inter-light-emitting-element partition 110 is provided between the micro light emitting elements 100. The inter-light-emitting-element partition 110 preferably has light blocking properties so that light from one of the micro light emitting elements 100 does not enter another one of the micro light emitting elements 100 separate from and adjacent to the one of the micro light emitting elements 100. In particular, the inter-light-emitting-element partition 110 is preferably reflective in order to reduce loss of light.

Further, in FIG. 1, sidewalls of the inter-light-emitting-element partition 110 are illustrated as being vertical, but the sidewalls may be inclined so as to be open toward the light emission direction in order to improve the light extraction efficiency of the micro light emitting elements 100.

In FIG. 1, at the light emitting surface 130, the surface of the micro light emitting element 100 and the surface of the inter-light-emitting-element partition 110 are illustrated as being at the same height, but those surfaces need not necessarily be at the same height. Further, the light emitting surface 130 may be provided with a concave-convex structure, a diffraction pattern, or the like for improving the light extraction efficiency, or for controlling light distribution properties.

An inter-pixel partition 10 is disposed upward of the light emitting surface 130. As illustrated in FIG. 1, an optical path 15 surrounded by the micro light emitting elements 100, the inter-pixel partition 10, and a microlens 20 is a space. Side surfaces 10S of the inter-pixel partition 10 are light reflective. In this way, the side surfaces 10S of the inter-pixel partition 10 reflect light emitted by the micro light emitting elements 100. Since, of light emitted from the light emitting surface 130, light traveling toward an adjacent pixel is reflected by the inter-pixel partition 10, optical crosstalk that causes the light so enter the microlens of the adjacent pixel can be completely prevented.

The space may be filled with air, dry air, nitrogen or other inert gasses like argon. Especially it is preferable neither to include water nor oxygen to protect nano-particles included in the wavelength converter from degradation.

Furthermore, by causing the light reflected by the inter-pixel partition 10 to enter the microlens of that pixel, the optical output of the pixel can be improved.

The reflection of the inter-pixel partition side surfaces 10S may be mirror reflection or diffuse reflection. In other words, the inter-pixel partition side surfaces 10S may be flat mirror surfaces or uneven surfaces with recesses and protrusions. Alternatively, the inter-pixel partition side surfaces 10S may be formed of a resin material containing fine particles having high reflectivity. For example, the inter-pixel partition side surfaces 10S may be formed from silver or aluminum having high reflectivity with respect to visible light, or may be a dielectric multilayer film.

The inter-pixel partition 10 may be constituted by a single member, or may be constituted by a central portion formed from a resin, and side surfaces formed from a metal thin film or a dielectric multilayer film as described above.

The inter-pixel partition 10 is preferably disposed on the inter-light emitting element partition 110 at the light emitting surface 130. When the surface of the micro light emitting element 100 is covered, the light extraction efficiency is reduced. Thus, it is not preferable that the inter-pixel partition 10 cover the light emitting surface 130 of the micro light emitting element 100.

Figure 4:
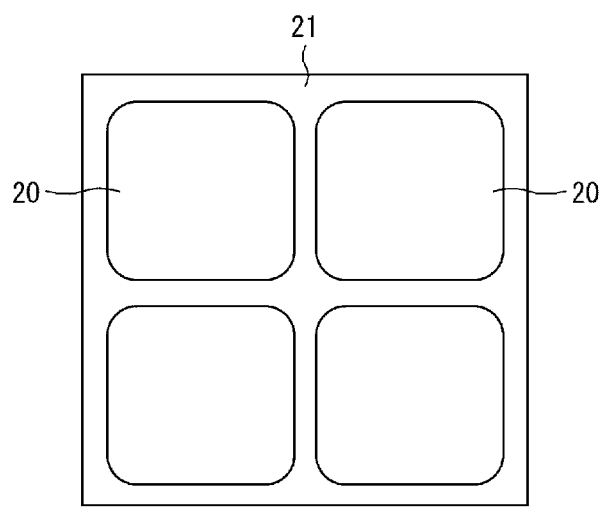
FIG. 4 is a schematic plan view of microlenses of the image display element according to the first embodiment of the present disclosure.

As illustrated in FIG. 1 and FIG. 4, the microlenses 20 are disposed upward of the inter-pixel partition 10. In these drawings, the microlenses 20 of each of the pixels 5 are connected to each other by a microlens holder 21 and are integrated as a microlens array. The pixel 5 includes a single microlens 20. In other words, the blue light emitting element 100B, the green light emitting element 100G, and the red light emitting element 100R included in the pixel 5 share a single microlens 20.

The microlens array is connected to the inter-pixel partition 10 via the microlens holder 21. In other words, the microlens array is mechanically held by the inter-pixel partition 10. However, the configuration of the microlens array is not limited to this example. For example, the microlens holder 21 may be omitted, and the microlenses 20 may be directly connected to the inter-pixel partition 10.

Alternatively, the microlenses 20 may be held via the microlens holder 21, independently from the inter-pixel partition 10. In other words, the microlens array including the microlenses 20 may be mechanically held independently from the driving circuit substrate 50.

The cross-sectional shape of the microlens 20 may be a spindle shape, or may be a single-side hemispherical convex shape protruding upward or a single-side hemispherical convex shape protruding downward. The surface shape of the microlens 20 may be spherical or aspherical, or may be shaped as a Fresnel lens. The planar shape of the microlens 20 may be rotationally symmetrical, or may be linearly symmetrical both vertically and horizontally. The material of the microlens 20 may be an inorganic material such as glass, or may be a resin material having a high refractive index.

The microlens 20 is preferably disposed so that the light emitting surface 130 is roughly aligned with a focal surface downward of the microlens 20. Light emitted from the microlens 20 can be emitted in the forward direction. The light emitting surface 130 may be disposed further toward the microlens 20 side than the focal surface downward of the microlens 20. In this case, the light convergence in the forward direction decreases, but, as a result of the microlens 20 becoming closer to the light emitting surface 130, the amount of light collected by the microlens 20 increases. As a result, the amount of light captured by an optical system of a display device can be significantly increased, compared to a case in which the microlenses 20 are not provided.

As described above, the image display element 200 includes the pixels 5, the driving circuit substrate 50, the microlenses 20, and the inter-pixel partition 10. Each of the pixels 5 includes the micro light emitting elements 100 arranged in an array. The driving circuit substrate 50 includes a driving circuit that supplies a current to the micro light emitting elements 100 and causes the micro light emitting elements 100 to emit light. Each of the microlenses 20 is disposed for a corresponding one of the pixels 5. The inter-pixel partition 10 is disposed between the pixels 5 and extends from the light emitting surface 130 of the micro light emitting element 100 to the microlens 20.

As described above, the micro light emitting elements 100 are disposed on the driving circuit substrate 50, the inter-pixel partition 10 is disposed on the micro light emitting elements 100, and further, the microlenses 20 are disposed on the inter-pixel partition 10. In other words, from the driving circuit substrate 50 side, by disposing the micro light emitting elements 100, the inter-pixel partition 10, and the microlenses 20 in this order, light distribution control can be performed to strengthen light emission in the forward direction, while preventing the occurrence of optical crosstalk caused by the microlenses 20. As a result, a high-quality image display element having high contrast and high color rendering properties can be provided. Furthermore, by strengthening the light emission in the forward direction, power consumption can be reduced.

Second Embodiment

Figure 5:
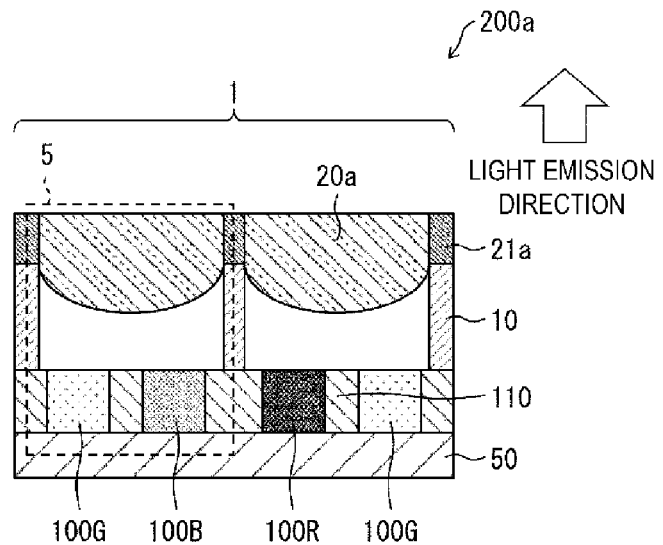
FIG. 5 is a schematic cross-sectional view of a pixel region of an image display element according to a second embodiment of the present disclosure.

A second embodiment will be described with reference to FIG. 5. In the first embodiment, both surfaces of the microlens 20 each have a convex shape; however, in an image display element 200a of the present embodiment, a microlens 20a has a convex shape on the micro light emitting element 100 side, but the surface on the light emission direction side is a plane. In other respects, there is no difference from the first embodiment.

In the image display element 200a, the thickness of a microlens holder 21a can be easily increased, and it is thus possible to increase the mechanical strength of the microlens array. As a result, the microlens array can be manufactured separately from the micro light emitting elements 100. For example, a glass substrate can serve as the microlens holder 21a, and the convex-shaped microlenses 20a can be formed on the glass substrate and then attached to the micro light emitting elements 100 via the inter-pixel partition 10. As a result, production efficiency of the image display element 200a can be improved, and production costs can thus be reduced.

Furthermore, by keeping the microlens array separate from the driving circuit substrate 50, it is easy to adjust the distance between the microlens array and the light emitting surface 130. As a result, the distance between the microlens array and the light emitting surface 130 can be accurately set to be the focal length of the microlens 20a. In this way, the luminous efficiency can be further increased.

According to the present embodiment also, similar effects to those of the first embodiment can be achieved. Furthermore, secondary effects such as a reduction in the production costs and an improvement in the luminous efficiency can also be achieved.

Third Embodiment

Figure 6:
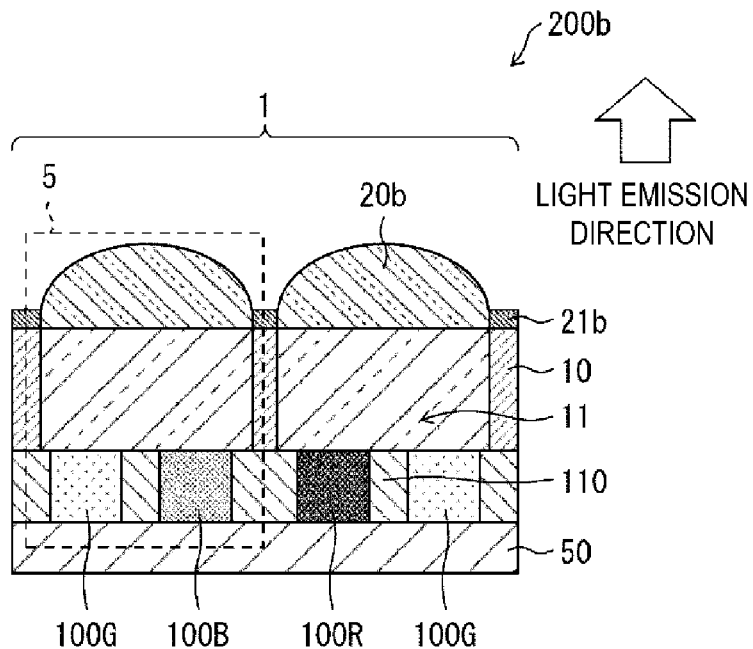
FIG. 6 is a schematic cross-sectional view of a pixel region of an image display element according to a third embodiment of the present disclosure.

A third embodiment will be described with reference to FIG. 6. In the first embodiment, the optical path 15, which is the space between the microlens 20 and the micro light emitting element 100, is only filled with gasses, but in an image display element 200b of the present embodiment, a portion corresponding to the optical path 15 described in the first embodiment is replaced by a transparent portion 11. In this way, the space surrounded by the micro light emitting elements 100, the inter-pixel partition 10, and a microlens 20b is filled with a transparent material.

Further, the microlens 20b has a convex shape in the light emission direction, but the surface of the microlens 20b on the micro light emitting element 100 side is a plane. In other respects, there is no difference from the first embodiment. Note that the side, of the microlens 20b, that is in contact with the transparent portion 11 may have a convex shape protruding downward.

The transparent portion 11 is transparent in the visible light band, and is made of a resin having a lower refractive index than that of the microlens 20b. The lower the refractive index of the transparent portion 11, the more preferable. It is particularly preferable that the refractive index of the transparent portion 11 be 1.3 or less.

By replacing the optical path 15 in the first embodiment by the transparent portion 11 in the image display element 200b, the strength of the inter-pixel partition 10 is reinforced, and the microlens array can thus be easily held. When the inter-pixel partition 10 and the transparent portion 11 are disposed, the upper surfaces of the inter-pixel partition 10 and the transparent portion 11 become substantially planar, and since they are adhered to the driving circuit substrate 50, various processes can be further performed on the upper surfaces of the inter-pixel partition 10 and the transparent portion 11. For example, the microlenses 20b can be formed.

In such a manufacturing process, the lower surface of the microlens 20b is substantially planar, and the upper surface thereof has a convex shape. Further, in such a manufacturing process, a microlens holder 21b can also be omitted.

In the manufacturing method described above, the microlenses 20b can be formed using a photolithography technique. As a result, the positional accuracy of the microlenses 20b disposed for each of the pixels 5 can be improved.

Thus, the optical axis of the microlens 20b is easily aligned with the center of the pixel 5. If the optical axis of the microlens 20b deviates from the center of the pixel 5, the center of the light emission direction deviates from the perpendicular direction (the forward direction) with respect to the light emitting surface 130, and this is not desirable. In the image display element 200b, since the optical axis of the microlens 20b is easily aligned with the center of the pixel 5, the light emission intensity in the forward direction is easily increased.

By replacing the optical path 15 in the first embodiment by the transparent portion 11, the focal length of the microlens 20b is increased compared with a case in which the transparent portion 11 is not provided. As a result, the distance between the microlens 20b and the micro light emitting element 100 is increased. Thus, it is necessary to increase the height of the inter-pixel partition 10.

In addition, by the light emitting surface 130 of the micro light emitting element 100 being covered with the transparent portion 11, the light extraction efficiency from the micro light emitting elements 100 to the transparent portion 11 is improved. As a result, the amount of light emitted to the outside from the optical path 15 via the microlens 20b is increased, and thus the light emission efficiency can be improved.

According to the present embodiment also, similar effects to those of the first embodiment can be achieved. Furthermore, secondary effects such as an improvement in the light emission efficiency and an increase in the light emission intensity in the forward direction can also be achieved.

Fourth Embodiment

A fourth embodiment will be described with reference to FIG. 7. In the first to third embodiments, the inter-pixel partition 10 is disposed between the pixels 5, but the inter-pixel partition 10 is not provided in an image display element 200c of the present embodiment.

Figure 7:
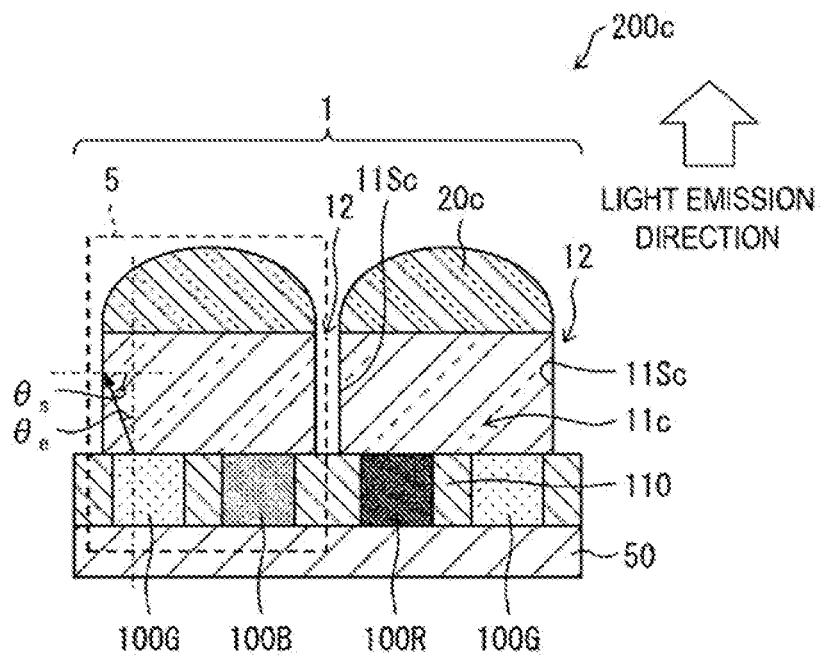
FIG. 7 is a schematic cross-sectional view of a pixel region of an image display element according to a fourth embodiment of the present disclosure.

As illustrated in FIG. 7, a transparent portion 11c is disposed so as to cover the light emitting surface 130 of the micro light emitting elements 100 in the pixel 5, and a microlens 20c is disposed on the light emitting surface side of the transparent portion 11c. In this configuration, there is no need for a microlens connection portion. The transparent portion 11c serves as optical path like the third embodiment. An inter-pixel space 12 is provided between the adjacent transparent portions 11c.

In this way, the image display element 200c includes the pixels 5 including the micro light emitting elements 100 arranged in the array, the driving circuit substrate 50 including the driving circuit that supplies current to the micro light emitting elements 100 to cause the micro light emitting elements 100 to emit light, the microlenses 20c disposed for each of the pixels 5, and the transparent portions 11c disposed between the micro light emitting elements 100 and the microlenses 20c. The transparent portion 11c is divided for each of the microlenses 20c, and a space is provided between the adjacent transparent portions 11c.

The distance between the microlens 20c and the light emitting surface 130 is preferably equal to or less than the focal length of the microlens 20c. As in the first embodiment, the microlens 20c may have a convex shape protruding both upward and downward, may have a convex shape protruding only downward as in the second embodiment, or may have a convex shape protruding only upward as in the third embodiment.

In this configuration, although it is not possible to completely prevent optical crosstalk from occurring via the microlens as in the first to third embodiments, a certain preventive effect can be achieved.

Of light entering the transparent portion 11c from the micro light emitting elements 100, light having a large angle and incident on a sidewall 11Sc of the transparent portion 11c is not emitted to the outside as a result of total reflection.

As illustrated FIG. 7, when the sidewall 11Sc is perpendicular with respect to the light emitting surface 130, an incident angle θs with respect to the sidewall 11Sc and an emission angle θe from the light emitting surface 130 have a relationship in which the sum of the two angles is 90 degrees (θs+θe=90°).

When a critical total reflection angle of the sidewall 11Sc is θc, light satisfying the relationship of θe≤90°−θc is not emitted to the outside from the sidewall 11Sc. On the other hand, light is emitted from the sidewall 11Sc to the outside, when the light satisfies the relationship of θe>90°−θc. Even when such light enters the transparent portion 11c of the adjacent pixel and is emitted to the outside via the microlens 20c, the light is emitted in a direction significantly shifted from the forward direction, and there is thus no significant impact on the image quality.

In the optical crosstalk that occurs via the microlens 20c, the most significant problem is, of light entering from the adjacent pixel, light forming a small angle with the optical axis of the microlens 20c. Such light passes through an upper portion of the sidewall 11Sc. Since the incident angle θs with respect to the sidewall 11Sc becomes larger the further from the light emitting surface 130, the light that causes the problem can be prevented from being emitted to the outside via the transparent portion 11c, as a result of the total reflection.

The configuration as illustrated in FIG. 7 is advantageous in than there is no need for forming the inter-pixel partition 10 having a high aspect ratio. By using a transparent resin of a negative resist type, the transparent portion 11c can be formed using only the photolithography technique. After forming the transparent portion 11c, the microlens 20c can be formed on the upper surface of the transparent portion 11c. After forming a resin layer having a low refractive index, a groove may be provided using the photolithography technique and a dry etching technique. After forming the resin layer having the low refractive index, the microlens 20c may be formed, and the inter-pixel space 12 may be provided using the photolithography technique and the dry etching technique.

In the present embodiment, the micro light emitting elements 100, the transparent portions 11c, and the microlenses 20c are disposed in this order from the driving circuit substrate 50 side, and the micro light emitting elements 100 emit light in the direction opposite to the driving circuit substrate 50.

According to the present embodiment also, similar effects to those of the first embodiment can be achieved. Furthermore, a secondary effect of being able to use a simple manufacturing method can also be achieved.

Fifth Embodiment

Figure 8:
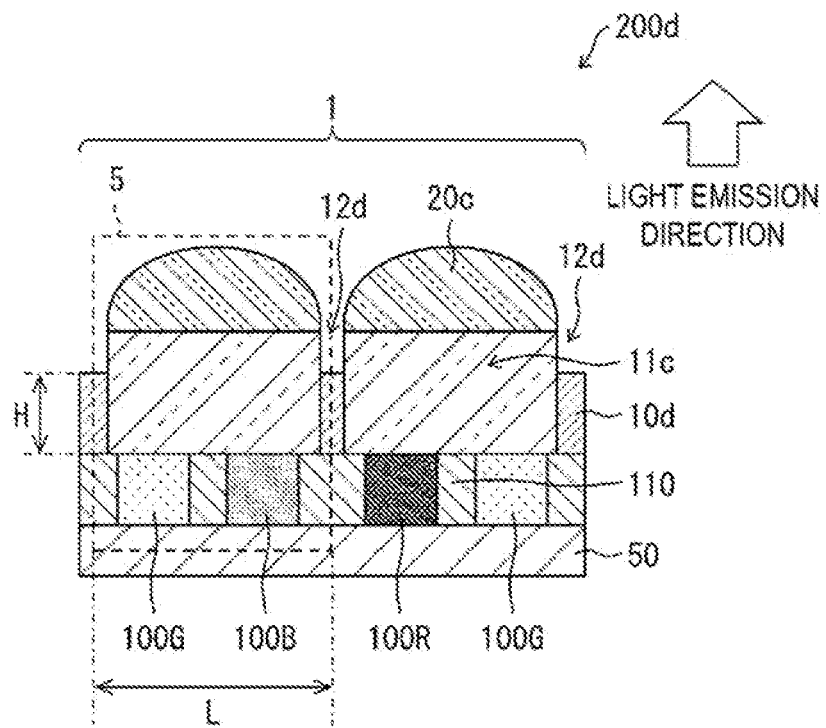
FIG. 8 is a schematic cross-sectional view of a pixel region of an image display element according to a fifth embodiment of the present disclosure.

A fifth embodiment will be described with reference to FIG. 8. An image display element 200d of the present embodiment is similar to the fourth embodiment, but is different in that the image display element 200d includes a low inter-pixel partition 10d. As illustrated in FIG. 8, the inter-pixel partition 10d is provided, between the transparent portions 11c, only on a side in contact with the inter-light-emitting-element partition 110.

In the configuration of the fourth embodiment, a direct impact on the quality of a display image can be reduced, but emission of light, such as light that is emitted to the outside from the microlens 20c and becomes stray light, cannot be prevented. In the image display element 200c, light satisfying the relationship θe>90°−θc may be emitted to the outside from the sidewall 11Sc, may enter the transparent portion 11c of the adjacent pixel, and may be emitted to the outside via the microlens 20c.

Since such light is emitted at a large angle with respect to the forward direction, the light may hit a housing of the display device and the like, and may become stray light, which may cause a decrease in contrast. Such light is emitted from a low position of the sidewall 11Sc (a position close to the light emitting surface 130). The inter-pixel partition 10d can prevent the occurrence of the stray light as described above, by covering a lower portion of the sidewall 11Sc.

As illustrated in FIG. 8, when the length of the pixel 5 in a horizontal plane direction is L, a height H of the inter-pixel partition 10d from the light emitting surface 130 preferably satisfies the following relationship.

$$H \geq L \cdot \tan \theta c.$$

When this relationship is satisfied, of the light incident on the sidewall 11Sc, the light incident thereon at an incident angle smaller than the critical total reflection angle θc is reflected by the inter-pixel partition 10d and is not emitted to the outside.

The inter-pixel partition 10d may fill a space between the transparent portions 11c, or may be a reflective thin film that covers the sidewall 11Sc of the transparent portion 11c. In this way, a reflective film is provided on the above-described sidewall 11Sc of the transparent portion 11c, on a side in contact with the micro light emitting elements 100.

Note that in the present embodiment, an inter-pixel space 12d is provided between the transparent portions 11c.

According to the present embodiment also, similar effects to those of the first embodiment can be achieved. Furthermore, a secondary effect of suppressing the occurrence of the stray light can also be achieved.

Sixth Embodiment

Figure 9:
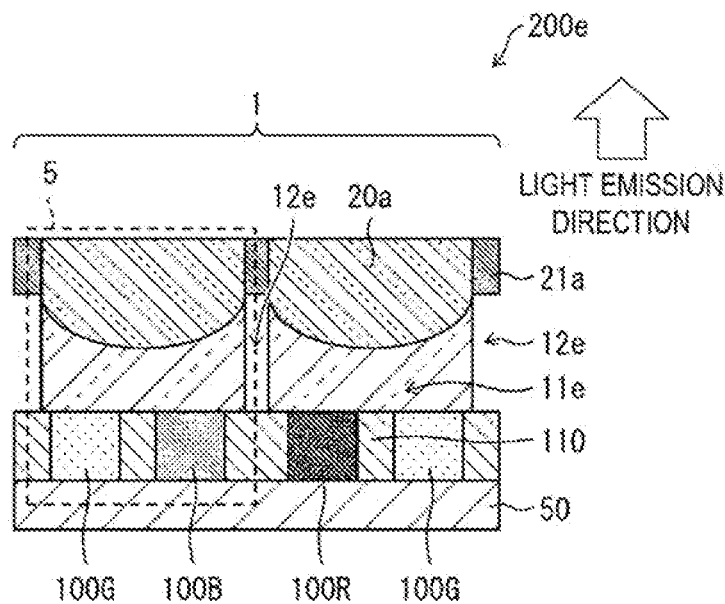
FIG. 9 is a schematic cross-sectional view of a pixel region of as image display element according to a sixth embodiment of the present disclosure.

A sixth embodiment will be described with reference to FIG. 9. In an image display element 200e of the present embodiment, in the same manner as in the second embodiment, the microlens 20a includes the thick microlens holder 21a and has a convex shape on the lower surface side. Further, as in the fourth embodiment, a transparent portion 11e is disposed between the microlens 20a and the light emitting surface 130, and an inter-pixel space 12e is provided between the transparent portions 11e.

The image display element 200e is advantageous in that the microlens array and the transparent portions 11e can be manufactured independently from each other. The image display element 200e can be manufactured by affixing the transparent portions 11e formed on the lower surface side of the microlenses 20a, to the micro light emitting elements 100 on the driving circuit substrate 50. The transparent portions 11e fix the microlens array to the micro light emitting elements 100, and can maintain an appropriate distance between the microlens array and the micro light emitting elements 100. Note that in FIG. 9, the lower surface of the microlens 20a is entirely in contact with the transparent portion 11e, but the lower surface of the microlens 20a need be only partially in contact with the transparent portion 11e. It is sufficient that the configuration be mechanically strong enough to maintain the distance between the microlens array and the micro light emitting elements 100. A transparent layer may interposed between the lower surface of the microlens 20a and the transparent portion 11e.

According to the present embodiment also, similar effects to those of the first embodiment can be achieved.

Seventh Embodiment

Figure 10:
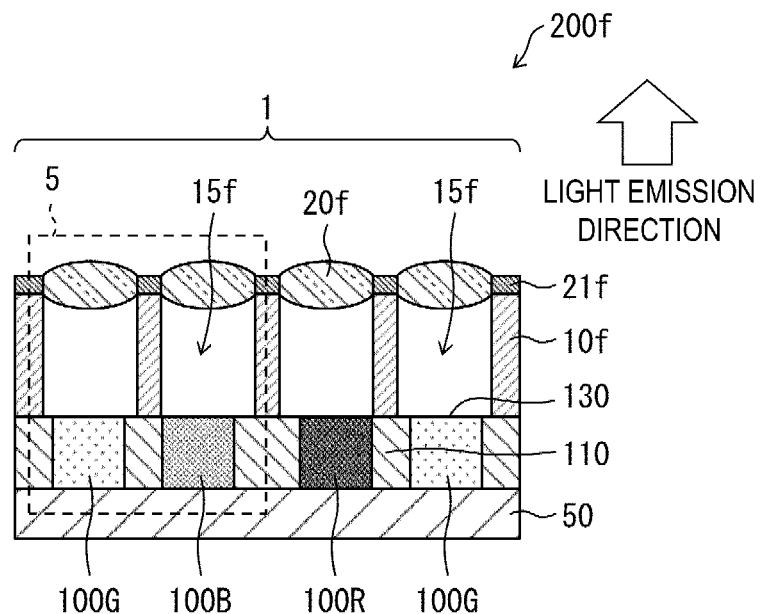
FIG. 10 is a schematic cross-sectional view of a pixel region of an image display element according to a seventh embodiment of the present disclosure.

A seventh embodiment will be described with reference to FIG. 10. An image display element 200f of the present embodiment is different from the first embodiment in that each of the micro light emitting elements 100 includes an individual microlens 20f. Other points are similar to those in the first embodiment. In this way, the pixel 5 includes the plurality of micro light emitting elements 100 that emit light at mutually different wavelengths, and the pixel 5 includes the microlens 20f for each of the plurality of micro light emitting elements 100.

As in the first embodiment, a structure in which the single microlens 20 is shared by the entirety of the pixel 5 is advantageous in that the microlens can be made larger, and more of the light emitted from each of the micro light emitting elements 100 can be concentrated.

However, in a configuration in which the red light emitting element 100R emits red light by converting the wavelength of blue light, when the configuration of the first embodiment is applied, as a result of a portion of light emitted by the blue light emitting element 100B being reflected by the lower surface of the microlens 20, the inter-pixel partition 10, or the like, and entering the red light emitting element 100R, red light may be emitted. In other words, optical crosstalk between the micro light emitting elements 100 occurs in the pixel 5.

By partitioning each of the micro light emitting elements 100 using an inter-pixel partition 10f, and disposing the microlens 20f for each of the micro light emitting elements 100, an occurrence of such optical crosstalk can be completely prevented.

According to the present embodiment also, similar effects to those of the first embodiment can be achieved. Furthermore, a secondary effect of preventing the occurrence of optical crosstalk in the pixel can also be achieved.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An image display element comprising:
   pixels disposed in an array, each of the pixels including a micro light emitting element;
   a driving circuit substrate including a driving circuit configured to supply a current to the micro light emitting element and to cause the micro light emitting element to emit light;
   a microlens disposed for each of the pixels; and
   an inter-pixel partition disposed between the pixels and extending from a light emitting surface of the micro light emitting element to the microlens,
   wherein an outer edge of each of the microlenses is held by a microlens holder, and
   the microlenses of the pixels are connected to each other and integrated by the microlens holder.

2. The image display element according to claim 1, wherein the micro light emitting element, the inter-pixel partition, and the microlens are disposed in this order from a driving circuit substrate side, and
   the micro light emitting element emits light in a direction opposite the driving circuit substrate.

3. The image display element according to claim 1, wherein a side surface of the inter-pixel partition reflects the light emitted by the micro light emitting element.

4. The image display element according to claim 1,
wherein an optical path, surrounded by the micro light emitting element, the inter-pixel partition, and the microlens, comprises a space.

5. The image display element according to claim 4,
wherein the microlens has a convex shape protruding toward a micro light emitting element side.

6. The image display element according to claim 5,
wherein a microlens array including the microlens is mechanically held independently from the driving circuit substrate.

7. The image display element according to claim 1,
wherein an optical path, surrounded by the micro light emitting element, the inter-pixel partition, and the microlens, is filled with a transparent material.

8. The image display element according to claim 7,
wherein the microlens has a planar shape on a micro light emitting element side.

9. The image display element according to claim 1,
wherein each of the pixels further includes a plurality of micro light emitting elements, including the micro light emitting element, configured to emit light at mutually different wavelengths, and each of the pixels includes a single one of the microlenses.

10. The image display element according to claim 1,
wherein each of the pixel includes pixels further includes:
a plurality of micro light emitting elements, including the micro light emitting element, configured to emit light at mutually different wavelengths, and
a corresponding one of the microlenses for each of the plurality of micro light emitting elements.

11. An image display element comprising:
pixels disposed in an array, each of the pixels including a micro light emitting element;
a driving circuit substrate including a driving circuit configured to supply a current to the micro light emitting element and to cause the micro light emitting element to emit light;
a microlens disposed for each of the pixels; and
a transparent portion disposed between the micro light emitting element and the microlens, wherein
the transparent portion is divided for each of the microlenses, and a space is provided between transparent portions that are adjacent to each other,
an outer edge of each of the microlenses is held by a microlens holder, and
the microlenses of the pixels are connected to each other and integrated by the microlens holder.

12. The image display element according to claim 11,
wherein the micro light emitting element, the transparent portion, and the microlens are disposed in this order from a driving circuit substrate side, and
the micro light emitting element emits light in a direction opposite the driving circuit substrate.

13. The image display element according to claim 11,
wherein an inter-pixel partition is provided between the transparent portions on a side in contact with an inter-light-emitting-element partition provided between the micro light emitting elements.

14. The image display element according to claim 13,
wherein a height of the inter-pixel partition is no less than $L \times \tan \theta c$,
L is a length of each of the pixels in a horizontal direction, and
$\theta c$ is a critical total reflection angle of the transparent portion.

15. The image display element according to claim 11,
wherein a reflective film is provided, at a sidewall of the transparent portion, on a side in contact with an inter-light-emitting-element partition provided between the micro light emitting elements.

16. The image display element according to claim 11,
wherein the pixels have a one-to-one correspondence to the microlenses, and a surface of the microlens on a micro light emitting element side is a plane.

17. The image display element according to claim 11,
wherein a surface of the microlens holder in a light emission direction is a plane.

18. The image display element according to claim 11,
wherein each of the pixels further includes a plurality of micro light emitting elements, including the micro light emitting element, configured to emit light at mutually different wavelengths, and each of the pixels includes a single one of the microlenses.

19. The image display element according to claim 11,
wherein each of the pixels further includes:
a plurality of micro light emitting elements, including the micro light emitting element, configured to emit light at mutually different wavelengths, and
a corresponding one of the microlenses for each of the plurality of micro light emitting elements.

* * * * *